(12) United States Patent
Pichler

(10) Patent No.: US 8,304,019 B1
(45) Date of Patent: Nov. 6, 2012

(54) ROLL-TO-ROLL ATOMIC LAYER DEPOSITION METHOD AND SYSTEM

(75) Inventor: Karl Pichler, Santa Clara, CA (US)

(73) Assignee: Nanosolar Inc., San Jose, CA (US)

( * ) Notice: Subject to any disclaimer, the term of this patent is extended or adjusted under 35 U.S.C. 154(b) by 1737 days.

(21) Appl. No.: 10/782,233

(22) Filed: Feb. 19, 2004

(51) Int. Cl.
*C23C 16/00* (2006.01)

(52) U.S. Cl. ..................... 427/248.1; 118/718

(58) Field of Classification Search ............... 427/248.1; 118/718
See application file for complete search history.

(56) References Cited

U.S. PATENT DOCUMENTS

| | | | | |
|---|---|---|---|---|
| 4,492,181 | A * | 1/1985 | Ovshinsky et al. | 118/718 |
| 5,016,562 | A * | 5/1991 | Madan et al. | 118/719 |
| 5,273,911 | A * | 12/1993 | Sasaki et al. | 438/62 |
| 5,482,570 | A | 1/1996 | Saurer et al. | 136/255 |
| 5,525,440 | A | 6/1996 | Kay et al. | 429/111 |
| 5,674,325 | A | 10/1997 | Albright et al. | 126/250 |
| 5,908,507 | A * | 6/1999 | Onabe et al. | 118/718 |
| 5,986,206 | A | 11/1999 | Kambe et al. | 136/263 |
| 5,990,415 | A | 11/1999 | Green et al. | 136/255 |
| 6,075,203 | A | 6/2000 | Wang et al. | 136/256 |
| 6,107,562 | A | 8/2000 | Hashimoto et al. | |
| 6,186,090 | B1 * | 2/2001 | Dotter et al. | 118/718 |
| 6,270,846 | B1 | 8/2001 | Brinker et al. | 427/385.5 |
| 6,278,056 | B1 | 8/2001 | Sugihara et al. | 136/263 |
| 6,291,763 | B1 | 9/2001 | Nakamura | 136/256 |
| 6,340,789 | B1 | 1/2002 | Petritsch et al. | 136/263 |
| 6,743,475 | B2 * | 6/2004 | Skarp et al. | 427/255.31 |
| 2002/0017656 | A1 | 2/2002 | Graetzel et al. | 257/184 |
| 2002/0134426 | A1 * | 9/2002 | Chiba et al. | 136/263 |
| 2004/0159285 | A1 * | 8/2004 | Doehler et al. | 118/718 |
| 2004/0201027 | A1 * | 10/2004 | Ghosh | 257/99 |
| 2005/0084610 | A1 * | 4/2005 | Selitser | 427/248.1 |

OTHER PUBLICATIONS

M.A. Cameron, et al. "Atomic layer Depositon of $SiO_2$ and $TiO_2$ in Alumina Tubular Membranes: Pore Reduction and Effect of Surface Species on Gas Transport" in *Langmuir* 2000, vol. 16, pp. 7435-7444, Published on web Jun. 10, 2000, American Chemical Society, Washington, DC.

* cited by examiner

*Primary Examiner* — Bret Chen
*Assistant Examiner* — Elizabeth Burkhart
(74) *Attorney, Agent, or Firm* — Joshua D. Isenberg; JDI Patent

(57) ABSTRACT

Atomic layer deposition in a roll-to-roll manufacturing environment is disclosed. At least a portion of a substrate from a first roll is disposed in a chamber. A first atomic layer deposition (ALD) half reaction is performed on the portion of the substrate while the portion is within the chamber. A subsequent ALD half reaction may be performed on the same portion of the substrate to form a layer of material. Multiple ALD sequences may be performed by passing the substrate through a sequence of ALD reaction chambers or by passing the substrate through one or more ALD reaction chambers in a continuous loop.

11 Claims, 3 Drawing Sheets

ROLL-TO-ROLL ATOMIC LAYER DEPOSITION METHOD AND SYSTEM

CROSS-REFERENCE TO RELATED APPLICATION

This application is related to commonly-assigned co-pending application Ser. No. 10/782,163, titled "DEVICE BASED ON COATED NANOPOROUS STRUCTURE", which is filed the same day as the present application, the entire disclosures of which are incorporated herein by reference. This application is also related to commonly assigned, co-pending application Ser. No. 10/782,545, entitled "HIGH THROUGHPUT SURFACE TREATMENT ON COILED FLEXIBLE SUBSTRATES", which is filed the same day as the present application, the entire disclosures of which are incorporated herein by reference.

FIELD OF THE INVENTION

The present invention is directed to depositing thin films on large area substrates and more specifically to atomic layer deposition in a high-throughput roll-to-roll production system.

BACKGROUND OF THE INVENTION

Atomic Layer Deposition (ALD) is a high-quality thin-film deposition technique based on sequential, self-limiting surface reactions. Atomic layer deposition works by sequentially exposing a substrate to at least one reactant vapor or solution and, for example, maintaining the substrate temperature in a certain range, depending on the deposited materials. With each vapor exposure a self-limiting reaction occur on the surface of the substrate if the substrate temperature is within a certain range. In some cases, the substrate may be at ambient temperature and the energy necessary for the surface reaction may be supplied, e.g., via plasma or ions). ALD can control the thickness of deposited films at the level of an atomic layer. Thus films deposited by ALD tend to be uniform over large areas. In addition ALD allows deposition of conformal films on structures having very high aspect ratios (e.g., >10). A wide variety of materials may be deposited by ALD, including semiconductors, metals, oxides, nitrides, and other materials ALD techniques can thus deposit thin films one atomic layer at a time, in a "digital" fashion. Such "digital" build-up of material greatly simplifies thickness control, thus reducing both the complexity and cost of thin film deposition.

Many industries, such as the optoelectronics industry, can benefit from the high uniformity, high aspect ratio conformal coating abilities and low cost of ALD. Unfortunately, prior art ALD systems have mostly been made for semiconductor wafer processing, which is oriented to batch processed wafer handling systems. Although existing ALD systems are suitable for the semiconductor industry, they are unsuitable for high volume manufacturing of large area devices such as photovoltaic cells. Current ALD systems are typically designed to coat small area wafers. Scaling up systems that coat a small area at a time might not be practical for coating large area sheets, panels or rolls of material. ALD may be too slow if many cycles are required to deposit the desired film thickness and each reaction step is rate-limited.

Thus, there is a need in the art, for a high throughput atomic layer deposition method and system.

BRIEF DESCRIPTION OF THE DRAWINGS

The teachings of the present invention can be readily understood by considering the following detailed description in conjunction with the accompanying drawings, in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Figure 1A:
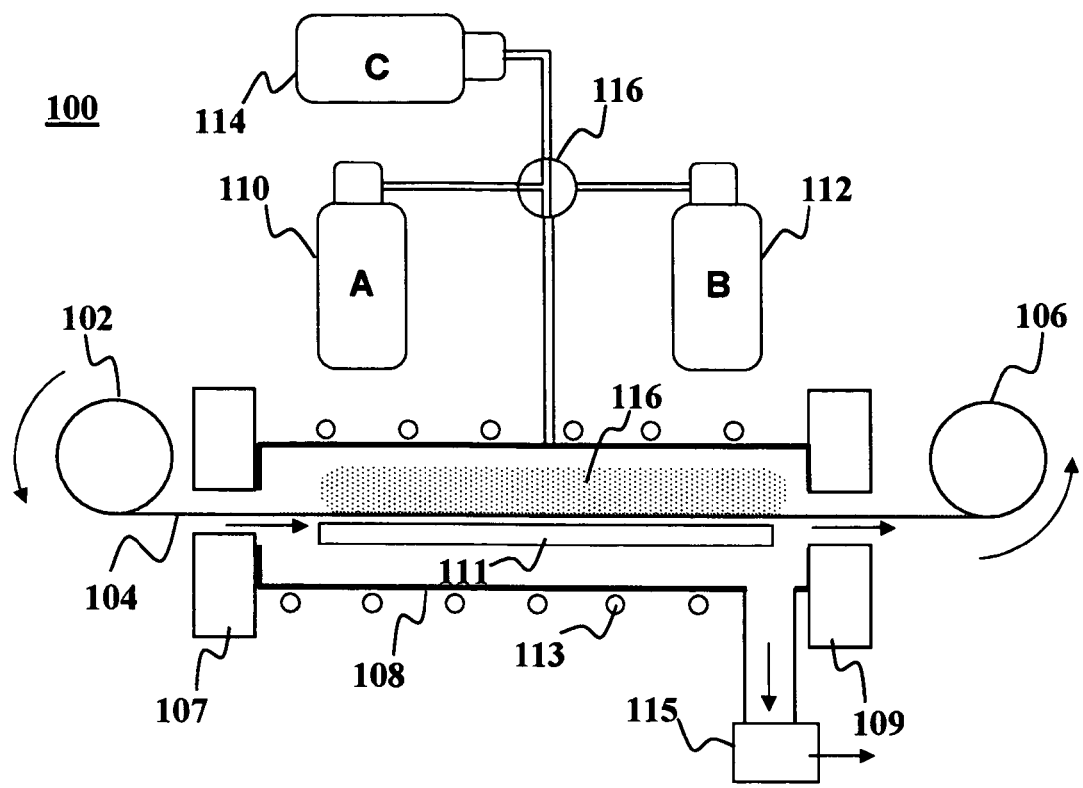
FIGS. 1A-1B are schematic diagrams of a roll-to-roll atomic layer deposition system according to an embodiment of the present invention.
Figure 1B:
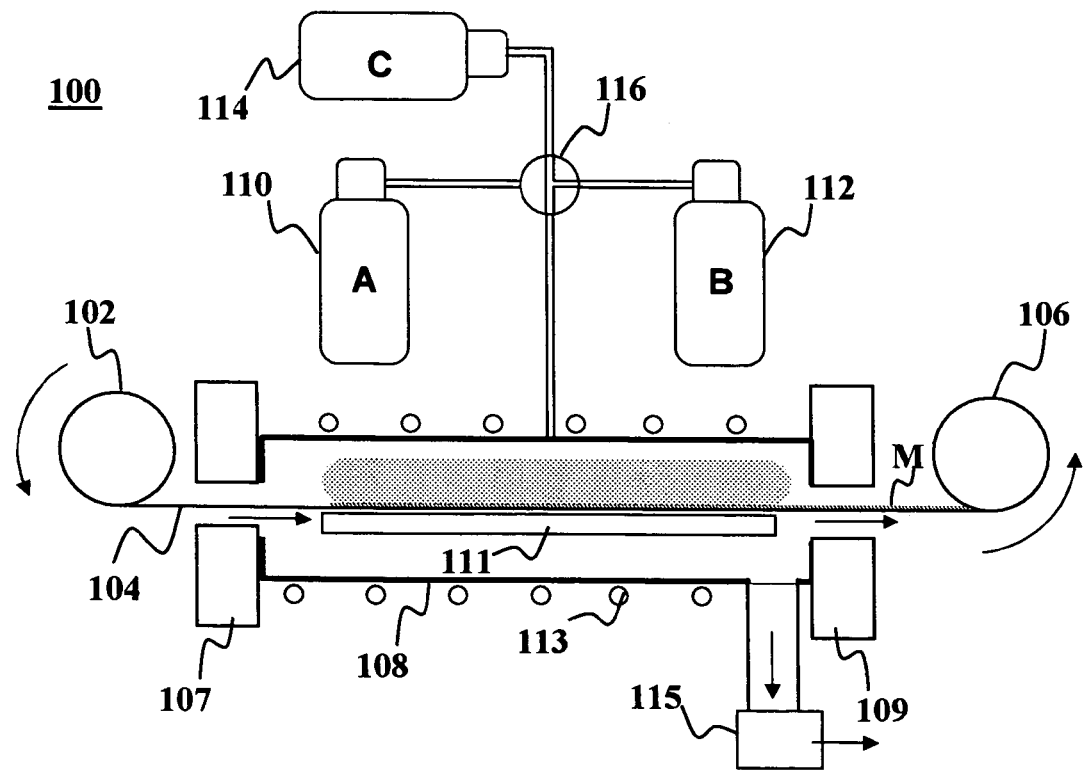

According to embodiments of the present invention, Atomic Layer Deposition (ALD) may be applied in a roll-to-roll production system. An example of such a system and method are depicted in FIGS. 1A-1B. The system 100 may generally be an atomic layer deposition chamber 108 that is configured to receive a flexible substrate 104 from a first roll 102. The system 100 may further a second roll 106 with the atomic layer deposition (ALD) chamber 108 disposed between the first and second rolls 102, 106. The first and second roll 102, 106 may be capable of winding and unwinding the substrate 104 in such a way that a portion of the substrate 104 passes through the deposition chamber 108. By way of example, the rolls 102, 106 may include a core or spool upon which the substrate may be wrapped in a spiral sheet. By way of example, the substrate 104 may be a metal or alloy foil, polymer or other material foil, a coated polymer/plastic foil, a laminated foil, a pre-treated and/or pre-structured foil or pre-treated/structured layers on a foil, etc. The rolls 102, 106 may be driven, e.g., by motors or other suitable mechanisms, so that the substrate 104 may be unwound in a continuous roll from one roll and taken up and wound up into a roll by the other. Guide rollers, tensioning rollers and other suitable mechanisms may be disposed between the first and second rolls 102, 106 to keep the flexible substrate 104 straight and aligned as it passes through the chamber 108 e.g., through slit valves located at either end.

The ALD chamber 108 generally comprises a vessel configured to confine one or more gases. A pumping system 115 removes gases from the interior of the chamber 108 and can assist to regulate the pressure of gases inside the chamber 108. First and second load locks 107, 109 may allow the substrate to pass in and out of the chamber 108 while isolating the environment inside the chamber from the atmosphere outside the chamber. The load locks 107, 109 may pump down the chamber 108 from atmospheric pressure, clean or otherwise pre-treat the surface of the substrate 104, or remove residual gases from the chamber 108. The load locks 107, 109 may include multiple differential pumping sections that decrease pressure in stages with the higher pressure being at the stage furthest from the chamber 108. By way of example, either or both of the load locks 107, 109 may also include equipment for pre-treatment of the substrate 104 by plasma, UV-ozone, heat (e.g., infrared), corona or combinations thereof. In addition, either or both of the load locks 107, 109 may include equipment for performing one or more treatment and/or coating steps that are performed prior or subsequent to atomic layer deposition that is performed in the chamber 108. Such post-ALD steps may include passivation, or coating the ALD treated substrate 104 with, e.g., an organic or inorganic material, structuring and/or patterning any layers pre-deposited on the substrate, etc. Alternatively, load locks 107, 109 may be configured to provide a suitable transition between the chamber 108 and other parts of a larger web-coating/-processing-treatment line.

By way of example, an anodization or anodization-based surface coating structuring line may precede chamber 108. The chamber 108 may include a substrate support 111, which may assure that the substrate follows a particular path through the chamber 108. By way of example, the substrate support may provide a flat backing surface for the substrate 104, e.g., via surface adhesion forces. Alternatively, the substrate support 111 may include, e.g., an electrostatic support, a vacuum support, one or more rollers on the sides of the substrate 104. The substrate support 111 may include an optional substrate temperature control element (e.g., heating and/or cooling element) to maintain the temperature of the substrate 104 within a specified range. In addition, the chamber 108 may be equipped with heaters (e.g., infrared heaters, light sources, plasma or UV-ozone or generally energetic particle sources, or ultraviolet radiation sources; generally energy sources that assist to convert the reactant ALD molecules adsorbed to the coating surface into their desired reacted/surface-bound state prior to the following ALD reaction/coating step(s)) or coolers that are separate from the substrate support 111. Such components may be in contact with or spaced apart from the substrate 104.

In some embodiments, one, or both of the rolls 102, 106 may be located in evacuated vessels that communicate with the ALD chamber 108 such that the substrate may be fed from the first roll 102 to the second roll 106 (and/or vice versa) through the chamber 108 without breaking vacuum. Furthermore, the chamber 108 may be part of a much larger coating line that may include other equipment for performing pre-ALD and post-ALD treatment of the substrate 104.

Gas sources 110, 112 supply reactant gases A and B for sequential atomic layer deposition processes that occur in the chamber 108. An optional purge gas source 114 may supply a purge gas C, e.g., an inert gas such as argon. The gas sources 110, 112, 114 may selectively supply either reactant gas A or reactant gas B and/or purge gas C though one or more gas lines and one or more valves 116. As described above, a substrate temperature control element may be disposed in the chamber 108 to control the temperature of a portion of the substrate 104 while it is in the chamber 108. A chamber temperature control element 113 (e.g., a heater and/or cooler) may be used in conjunction with or as an alternative to the substrate heater to maintain the temperature of the chamber 108 and/or substrate 104. At the right range of temperature and pressure and/or presence of other energy-rich species or generally energy sources, each reactant gas A, B may participate in a half-reaction at the surface of the substrate 104. When the two half-reactions are performed sequentially a very thin layer of material M, e.g., as little as one atomic layer or often part of one atomic layer, may be deposited on the substrate 104 as a result of the two half-reactions. By way of example, where reagent A is $TiCl_4$ and reagent B is water vapor ($H_2O$), the two half-reactions may deposit a layer of titania ($TiO_2$). Atomic layer deposition using these reactants is described, e.g., by M. A. Cameron, et al., in "Atomic Layer Deposition of $SiO_2$ and $TiO_2$ in Alumina Tubular Membranes: Pore Reduction and Effect of Surface Species on Gas Transport," Langmuir 2000, 16, 7425-7444, American Chemical Society, Washington D.C., the disclosures of which are incorporated herein by reference.

The system 100 may operate as follows. The substrate 104 may be wound up on the first roll 102, which acts as a supply reel. The first and second rolls 102, 106 rotate as shown in FIG. 1A and at least a portion of the substrate 104 (possibly the entire substrate, depending on the chamber design) unwinds from the first roll 102 and passes through the first load-lock 107 into the chamber 108. By way of example, an end portion of the substrate 104 may be fed into the chamber, e.g., through the first load lock 107, through the chamber 108, and out of the chamber 108, e.g., via the second load lock 109, to the second roll 106 which acts as a take up reel. The chamber 108 may be evacuated and/or purged with purge gas C either before or after the end portion of the substrate 104 has been fed through the chamber 108. The substrate temperature control element 111 and/or chamber temperature control element 113 adjust the chamber and/or substrate temperature to a desired temperature range for a first half-reaction that involves reactant A and the surface of the substrate 104. Alternatively, or in addition, other energy sources such as plasma, UV, ozone, etc. could be used. The pumping system 115 may adjust the pressure inside the chamber 108 to a suitable range for the first half-reaction with reactant A. The valve 116 is set so that reactant A flows from gas source 110 to the chamber 108 where the first half-reaction takes place with reactant A at a surface of the substrate 104.

Turning now to FIG. 1B, after the portion of the substrate 104 has been treated with the first reaction, the chamber 108 may be purged of reactant A, via purging and/or pumping. The substrate temperature control element and/or chamber temperature control element 113 may adjust the temperature of the substrate 104 and/or chamber 108 to a desired temperature range for a second half-reaction that involves reactant B and the products of the first half-reaction on the substrate 104. The pumping system 115 may adjust the pressure inside the chamber 108 to a suitable range for the second half-reaction. The valve 116 may be switched so that gas source 112 may supply reactant B to the chamber 108. The second half-reaction takes place in the chamber 108 with reactant B and the products of the first half-reaction. As a result of the first and second half-reactions, a very thin layer of material M may be deposited on a portion of the substrate 104.

After the substrate 104 has been treated with the first and second half-reactions a sufficient number of times to provide the desired thickness of material M the rolls 102, 106 may rotate in the directions shown in FIG. 1B to advance the coated section of the substrate 104 to the second roll 106. The A and B deposition reactions may then be repeated as previously described so that a layer of material M of sufficient thickness may be deposited on another portion of the substrate 104. Alternatively, the substrate may be re-wound onto the first roll 102, e.g., if the entire substrate 104 has been coated with a sufficient thickness of material M.

Alternatively, the system 100 may include multiple roll off/on or enough AB chambers with continuous substrate flow and/or step-wise flow that the entire thickness of material M is coated in one pass.

Many variations are possible on the embodiment depicted in FIGS. 1A-1B. For example, two or more ALD chambers may be connected in tandem with the flexible substrate passing through both chambers sequentially. One chamber may be configured for ALD with reactant A while the other is configured for ALD with reactant B. In such a configuration, a layer of material M may be deposited on a substrate as the substrate passes from one roll through the chambers to the other roll. Examples of such systems are depicted in FIGS. 2A-2C.

Figure 2A:
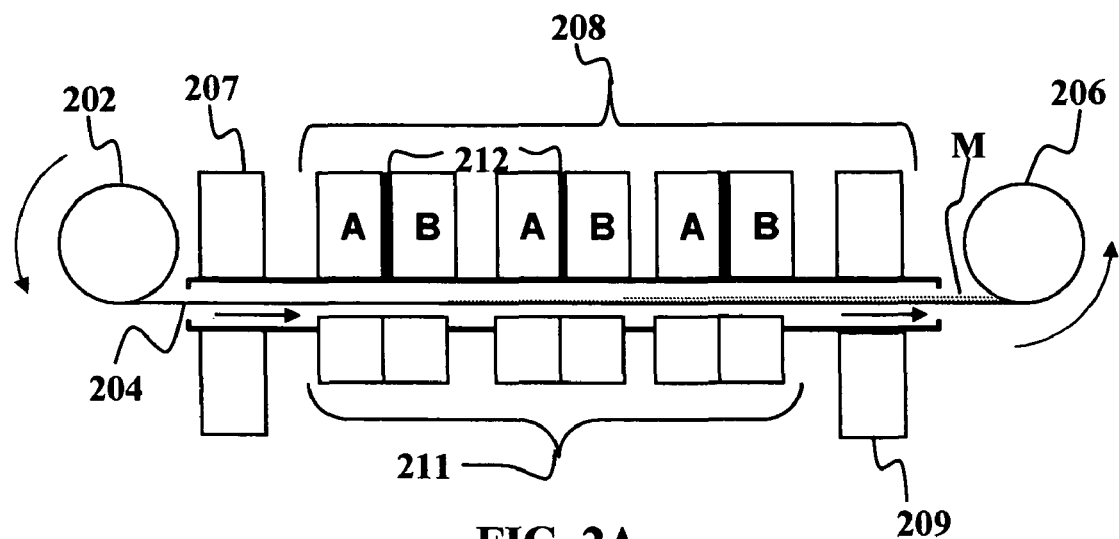
FIGS. 2A-2F are schematic diagrams of roll-to-roll atomic layer deposition systems according to alternative embodiments of the present invention.
Figure 2B:
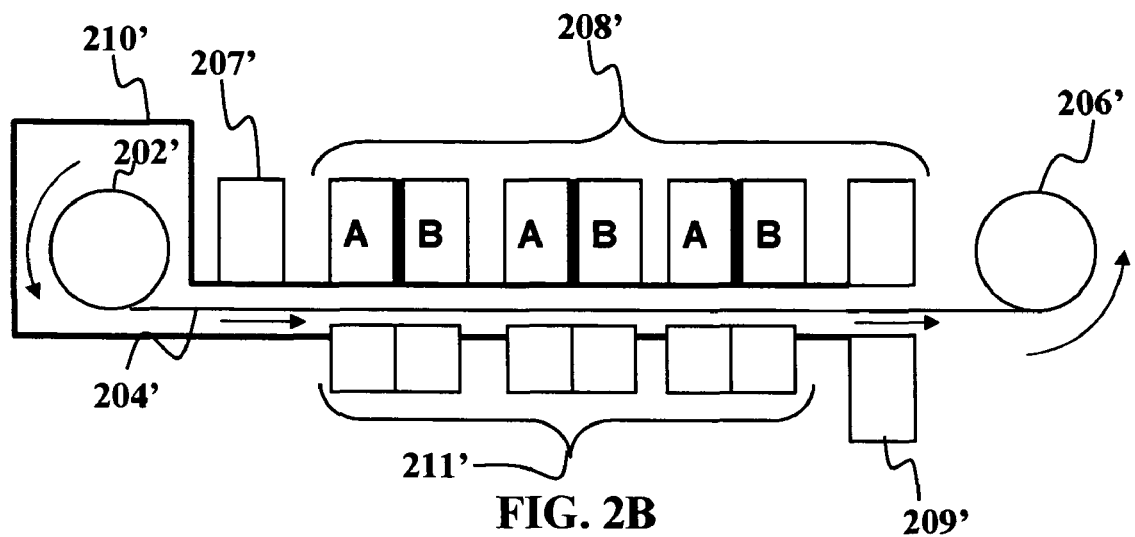
Figure 2C:
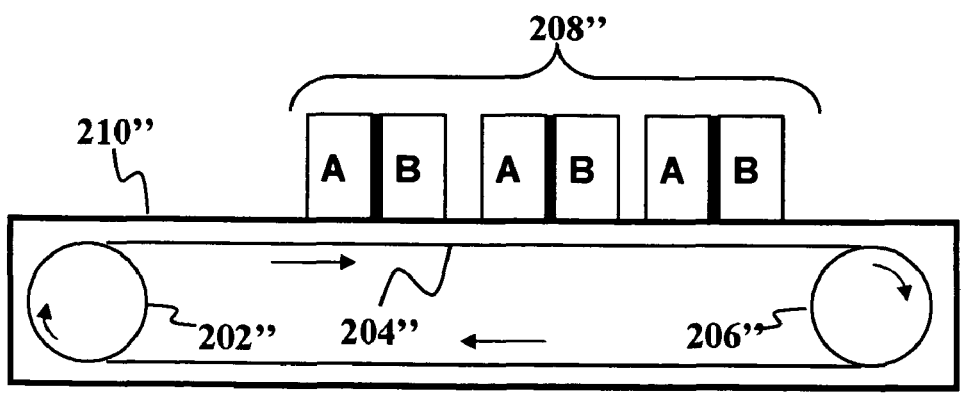

FIG. 2A depicts a first example of a roll-to-roll atomic layer deposition system 200 having multiple ALD chambers arranged sequentially. In the system 200 a substrate 204 passes through one or more chambers 208 on its way between a first roll 202 and a second roll 206. The substrate may pass into and out of the chambers 208 via load locks 207, 209, which may be as described above. The chambers 208 include a series of pairs of ALD sections for performing ALD reactions with reactants A and B as described above. The ALD sections are arranged in one or more A/B pairs, which may be connected to each other with vacuum tight connections. Alternatively, the A/B pairs may be disposed within a single chamber 208. The chamber(s) 208 may include one or more substrate supports 211, e.g., of the type described above. The substrate supports 211 may be in the form of individual supports with a separate substrate support 211 for each A or B ALD section. Alternatively, a single substrate support 211 may support the substrate 204 through two or more or even all of the A/B sections. The chamber(s) 208 may also include optional temperature control elements, light and/or UV, plasma, ions, ozone, etc. sources as described above. The A and B sections may be isolated from each other, e.g., by gas flow shims 212.

Gas flow shims 212 may be located between chambers/sections A and B or may be contained within each chamber A or B, or both. The gas flow shims could be shims/walls that separate gas flow or that separate pump flows, i.e. sections that go to pumping stations. In general, the shims serve to avoid contamination of reactant chambers/sections with reactant molecules from neighboring chambers/sections. The gas flow or 'pump flow', i.e. gas flowing towards the substrate 104 or away from it, or in various combinations, suppress contamination. Alternatively, or in addition, the reactant gases itself could be supplied or pumped away from the reactant chambers via the gas flow shims 212 in a way to avoid or suppress the supply of reactant gases into 'incorrect' adjacent chambers/sections.

Figures 2D, 2E:
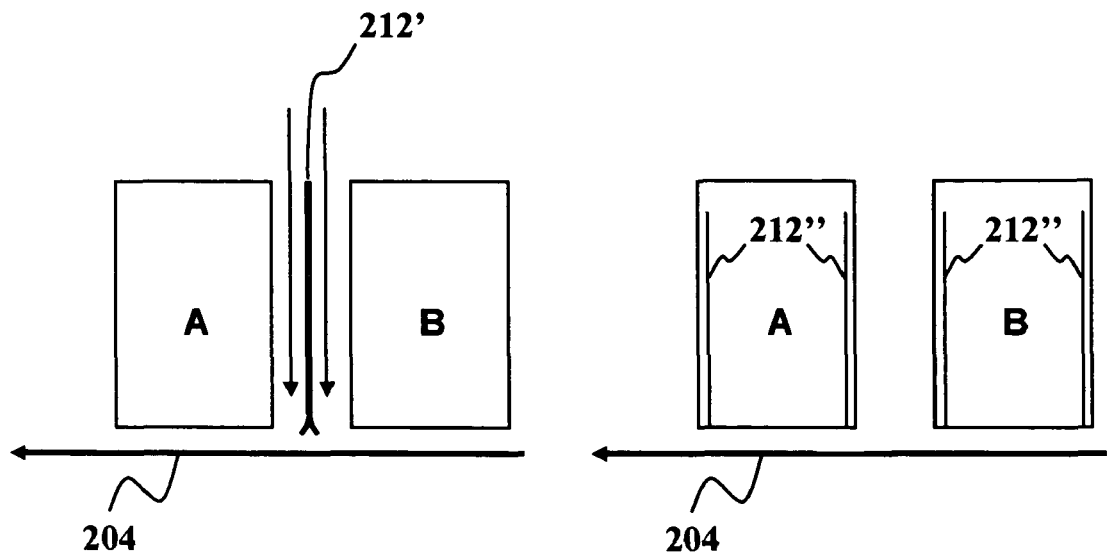
Figure 2F:
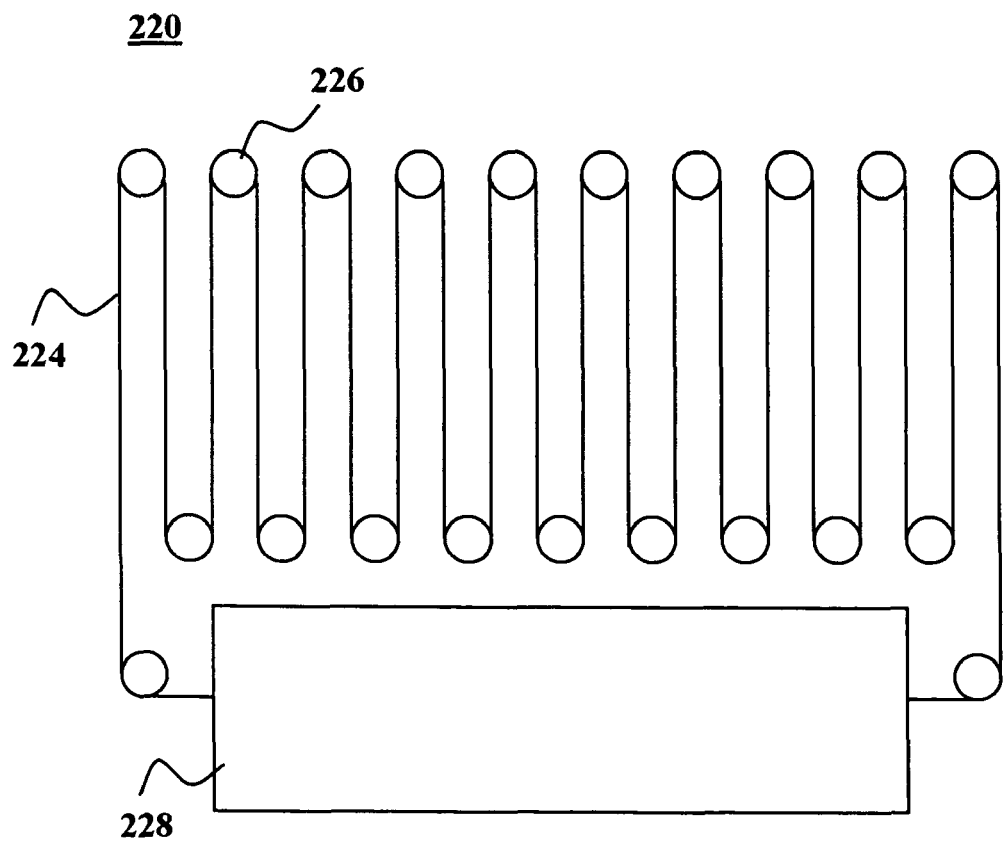

Some examples of gas flow shims are depicted in FIGS. 2D-2E. Specifically, FIG. 2D shows a gas flow shim in the form of a wall 212' between ALD chambers A and B. There is at least a small amount of clearance between the bottom of the wall 212' and the substrate 204. The wall 212' may separate the flow of gas being pumped into or out of the A and B chambers. For example, the wall 212' may direct a positive flow of purge gas toward the A and B chambers. The end of the wall 212' closest to the substrate 204 may be flared, as shown in FIG. 2D, to facilitate direction of the purge gas and/or reactant gases. Although a positive pressure gas flow is depicted in FIG. 2D, the wall 212' could also facilitate differential pumping. FIG. 2E depicts an alternative embodiment in which flow shims are implemented by walls 212" located inside the A and B chambers. The walls 212" may direct a positive or negative flow of purge gas and/or reactant gases. The configuration of FIG. 2E may be advantageous in terms of the modularity, i.e., flexible stacking, of the A and B chambers next to each other.

Although first and second rolls 202, 206 are depicted, some embodiments of the present invention may use only a single roll. For example, after the substrate 204 has been unwound from the first roll 202, ALD has been performed with the reactants A and B in the chamber 208, the substrate 204 may be cut into sections either before or after subsequent treatment, without winding up the substrate on a take-up roll.

An advantage of the system 200 of FIG. 2B is that a thicker layer of material M may be deposited on the substrate in less time. The thickness of the resulting layer of material M deposited on the substrate 204 depends on the number of A/B sections in the system 200. With a sufficient number of A/B sections it may be possible to deposit the layer of material M in a single pass through the chamber 208. Generally, the thickness tends to scale with the number of A/B sections. It is not necessary to perform ALD with all of the A/B sections. By allowing some A/B sections to remain idle while others perform ALD reactions, the thickness may be adjusted. For thicker layers, the substrate may be passed back through the chamber 200 by reversing the direction of the rolls 202, 206 after a sufficient length of the substrate 204 has been coated with the material M. Additional A/B sections may be added to the system 200 in a straightforward fashion.

The A/B pairs could either be in individual chambers or in separate chambers. In a specific embodiment, the chamber 208 is a sequence of individual separated chambers/pairs ABABABAB . . . with or without sections (e.g., gas flow shims 212) in between each AB or BA sequence to ensure low contamination/adequate purging or pumping in between AB or BA pairs, e.g. via adequate purge gas shims, and in which the number of AB corresponds to the total number of ALD deposition cycles required for the coating.

The coating line, i.e. chamber 208 could also be set up such that multiple adjacent sections of A/B to deposit a first material x are followed by more ALD chambers/sections to deposit a second material y, and so on. In this embodiment, the substrate foil 204 could, in one pass through the deposition system, be coated with two or more layers with the desired thickness (number of ALD cycles). In one example, one could coat a substrate with a nano/micro-structured surface for a photovoltaic (PV) cell, with e.g. a thin layer of a conductive oxide such as e.g. $SnO_x$, followed with a thin layer of a transparent n-type semiconductor such as titanium oxide ($TiO_x$), followed by a very thin, recombination-reducing layer of an interface insulator, such as aluminum oxide ($AlO_x$). Examples of nanostructured layers for PV cells are described, e.g., in commonly assigned co-pending application Ser. Nos. 10/290,119, 10/303,665, 10/443,456, the entire disclosures of which are incorporated herein by reference. One could, for example only, envisage a 20 monolayer conductive oxide coating, which would typically correspond to about 60 ALD A/B cycles, followed by a similar thickness of e.g. $TiO_x$, followed by e.g. 1-5 monolayers of e.g. $AlO_x$; this would constitute an ALD web-coating system according to an embodiment of the present invention with over 100 A/B chambers/sections in-line.

In an alternative embodiment, depicted in FIG. 2B, a roll-to-roll ALD system 200' may include an ALD chamber 208' that houses multiple A/B sections as well as a roll chamber 210' that houses a first roll 202'. The chamber 208' may include one or more pairs of sections for performing ALD half-reactions on the substrate 204' with first and second reactants A and B. A pre-treatment or post treatment stage 207' (or load lock) may be disposed between the first roll 202' and the A/B sections. A load lock (or pre-treatment or post-treatment stage) 209' may be disposed between the A/B sections and the second roll 206'. The chamber 208' may further include one or more substrate supports 211' as described above. In the embodiment depicted in FIG. 2A, the substrate 204' may be fed from the first roll 202' into the A/B sections under vacuum. Alternatively, the substrate may be fed from the second roll 206' to the chamber 208' and through the A/B sections, e.g., through the load lock 209' and taken up by the first roll 202' while still under vacuum. In another alternative embodiment, the second roll 206' may be housed in a roll chamber having features in common with the roll chamber 210'.

FIG. 2C depicts another alternative embodiment of a roll-to-roll ALD system 200" in which a substrate 204" passes between first and second rollers 202", 206" in an endless loop in a chamber 210". One or more ALD chambers 208", e.g., including pairs of sections for performing half reactions with reactants A and B, may be coupled to the chamber 210". The chamber 210" may include one or more substrate supports as described above. An advantage of the system 200" of FIG. 2C is that the thickness may be adjusted by increasing or decreasing the number of times that a given section of the substrate 204" passes through the ALD chambers 208". Thus a layer of material of arbitrary thickness may be deposited on the substrate 204" by ALD before removing the substrate 204" from the chamber 210". Alternatively, the 'endless loop' system could just pass one chamber A/B sequence whereby chambers/sections A/B could be adjacent to each other, with optional gas flow shims as described above, or chambers/ sections A/B could be physically separated. In this embodiment, each chambers A and B could be made longer (in the web direction) with or without continuous high flow of reactant gasses A and B in each respective chamber, such as to be able to perform the full A/B deposition sequences at higher web speeds.

The substrate may pass back and forth over more than two rollers to increase overall length of the substrate that can be accommodated by a continuous loop system. For example, as shown in FIG. 2D, a continuous loop ALD system 220 may include one or more ALD chambers 228 and a conveyor belt type system 222 that passes a substrate 224 through the chambers 228 in a continuous loop. The chambers 228 include ALD deposition chamber(s), e.g. A-purge-B-purge in one sequence or A purge B purge separated or Multiple A/B sequences, with or without heaters, plasma etc., e.g., as described above. The conveyor belt system includes multiple rollers 226. The substrate passes back and forth between the idler rollers in a way that increases the overall length of substrate 224 that can be coated by the system 220. To avoid undesired contact with a front surface of the substrate 224 (i.e., the side to be coated) the rollers 226 could hold the substrate 224 only on the side, as opposed to long rolls or cylinders spanning the whole width of the substrate 224. The edges of a foil/web substrate are may be discarded. Alternatively, the rollers 226 could be in the form of long rolls (of diameter d1) spanning the entire width of the substrate 224 whereby at certain positions along the length of the roll one has extra (spacer) collars or rings of diameter d2 (where d2>d1) which actually touch the substrate 224. Portions of the substrate 224 in between the (spacer) rings would not contact the idler rollers 226.

Embodiments of the present invention may facilitate atomic layer deposition on large area substrates at high throughput rates. Furthermore, embodiments of the present invention allow for roll-to-roll production of optoelectronic devices, such as solar cells, where one of the manufacturing steps is an atomic layer deposition step. Thus, large scale, high quality devices may be fabricated economically and efficiently.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. The appended claims are not to be interpreted as including means-plus-function limitations, unless such a limitation is explicitly recited in a given claim using the phrase "means for."

What is claimed is:

1. A roll-to-roll atomic layer deposition method, comprising the steps of:
    disposing at least a portion of a substrate from a first roll into a chamber having one or more gas flow shims to separate different sections of the same chamber and configured to direct gas flow or pump flow from one section away from gas flow or pump flow in another section of the same chamber;
    performing a first atomic layer deposition half reaction on the portion of the substrate while the portion is within one section of the chamber, wherein the deposition is a conformal deposition process depositing a single monolayer;
    creating directional gas flow over a surface of the one or more gas shims in a first direction and then in a second direction away from an adjacent section to suppress contamination of the one section by reactant molecules from another section, the gas shims simultaneously creates a reduced clearance over the substrate while also providing the surface for guiding directional gas flow, wherein gas shims are vertical walls that each have a flared tip located along one side of the chamber.

2. The method of claim 1 further comprising, collecting at least a portion of the substrate with a second roll.

3. The method of claim 1 further comprising:
    after performing the first atomic vapor deposition half-reaction, performing a second atomic vapor deposition half-reaction on the portion of the substrate.

4. The method of claim 3, wherein the first and second atomic vapor deposition half-reactions deposit titanium oxide or aluminum oxide.

5. The method of claim 3 wherein the first and second half-reactions take place in the same chamber.

6. The method of claim 1 further comprising using at least one load lock on the chamber which includes equipment for performing one or more treatment and/or coating steps that are performed prior to atomic layer deposition that is performed in the chamber.

7. The method of claim 6 further comprising wherein the load lock includes equipment for pre-treatment of the substrate by one of the following techniques: plasma, UV-ozone, infrared, corona, anodization, or combinations thereof.

8. The method of claim 1 further comprising using at least one load lock on the chamber which includes equipment for performing one or more treatment and/or coating steps that are performed after atomic layer deposition that is performed in the chamber.

9. The method of claim 1 further comprising at least one of the following steps: passivation, coating a treated substrate with an organic or inorganic material, or structuring and/or patterning any layers pre-deposited on the substrate.

10. The method of claim 1 further comprising using heaters located outside the chamber to heat the chamber and the substrate therein.

11. The method of claim 1 further comprising using rollers that hold the substrate only on a side or edge of the substrate.

* * * * *